United States Patent

Igarashi

[19]

[11] Patent Number: 5,986,961
[45] Date of Patent: Nov. 16, 1999

[54] SEMICONDUCTOR INTEGRATED CIRCUIT OF LOW POWER CONSUMPTION TYPE

[75] Inventor: Mutsunori Igarashi, Kanagawa-ken, Japan

[73] Assignee: Kabushiki Kaisha Toshiba, Kawasaki, Japan

[21] Appl. No.: 08/955,530

[22] Filed: Oct. 22, 1997

[30] Foreign Application Priority Data

Oct. 24, 1996 [JP] Japan ................................. 8-282454

[51] Int. Cl.⁶ ............................................ G11C 7/00
[52] U.S. Cl. ............................ 365/227; 365/226; 365/63; 365/214
[58] Field of Search .......................... 365/227, 63, 214, 365/226

[56] References Cited

U.S. PATENT DOCUMENTS

| | | | |
|---|---|---|---|
| 5,335,203 | 8/1994 | Ishii et al. ............................... | 365/226 |
| 5,361,223 | 11/1994 | Inoue et al. ............................... | 365/226 |
| 5,390,140 | 2/1995 | Tomishima et al. ..................... | 365/226 |
| 5,420,824 | 5/1995 | Kajimoto et al. ........................ | 365/227 |
| 5,598,363 | 1/1997 | Uchida ..................................... | 365/226 |
| 5,615,151 | 3/1997 | Furuno et al. ........................... | 365/226 |
| 5,724,293 | 3/1998 | Tomishima et al. ..................... | 365/226 |
| 5,781,491 | 7/1998 | Lee et al. ................................. | 365/227 |

Primary Examiner—David Nelms
Assistant Examiner—Tuan T. Nguyen
Attorney, Agent, or Firm—Foley & Lardner

[57] ABSTRACT

A semiconductor integrated circuit of a low power consumption type has modules (1) to which various supply voltages are provided. In each module (1), cells (3) are grouped into cell rows or cell columns. Only one of a wire (7) of a high supply voltage and a wire (5) of a low supply voltage is formed on each cell row or cell column in the module (1). Various supply voltages are provided into the target cell (3) through the electrical wires (5, 7).

12 Claims, 10 Drawing Sheets

FIG.1
PRIOR ART

SEMICONDUCTOR CHIP 9

POWER CELL AND FILLER CELLS ON VDDL CELL ROW

FIG.10

POWER CELL AND FILLER CELLS ON VDDL CELL ROW

SEMICONDUCTOR INTEGRATED CIRCUIT OF LOW POWER CONSUMPTION TYPE

BACKGROUND OF THE INVENTION

1. Field of the Invention

The present invention relates to a semiconductor integrated circuit of a low power consumption type, and more particularly, it relates to a semiconductor integrated circuit of a low power consumption type that is capable of operating under a plurality of supply voltages.

2. Description of the Related Art

In recent years, there have been significant advancements in architectures of semiconductor integrated circuits for processing various kinds of data such as image, video, and audio signal. Furthermore, a power consumption of semiconductor integrated circuits has been rapidly increased. For example, there are some processor chips in MPU (Microprocessor unit) and DSP (digital Signal Processing) whose power consumption becomes approximately more than several Watts from approximately several tens mW in 1980.

When the power consumption of a chip of a semiconductor integrated circuit is more than several watts, it is difficult to contain the chip in a plastic package that is relatively cheep in cost. This causes to increase the cost of packaging and cooling. Recently, since movable devices such as portable telephone devices and the like are the object of public attention all over the world and widely used, it is required to reduce a power consumption of a chip of a semiconductor integrated circuit so that the movable devices using a battery can be operated for a long time period. Under this circumstance, it becomes the important problem to reduce a power consumption of LSIs.

There are various technical approaches to reduce a power consumption of a CMOS circuit, for example, to reduce a load capacity and a switching probability. In general, because the power consumption is in proportion to the square of the voltage potential of a power source, it is more effective to reduce the voltage potential of the power source. However, when the voltage potential of the power source is reduced, the delay time of operation in a circuit is increased and the processing performance of the LSI is also decreased because the magnitude of a drain current in transistors is decreased.

In conventional techniques, various kinds of methods have been proposed in order to maintain the processing performance of the LSI.

Figure 1:
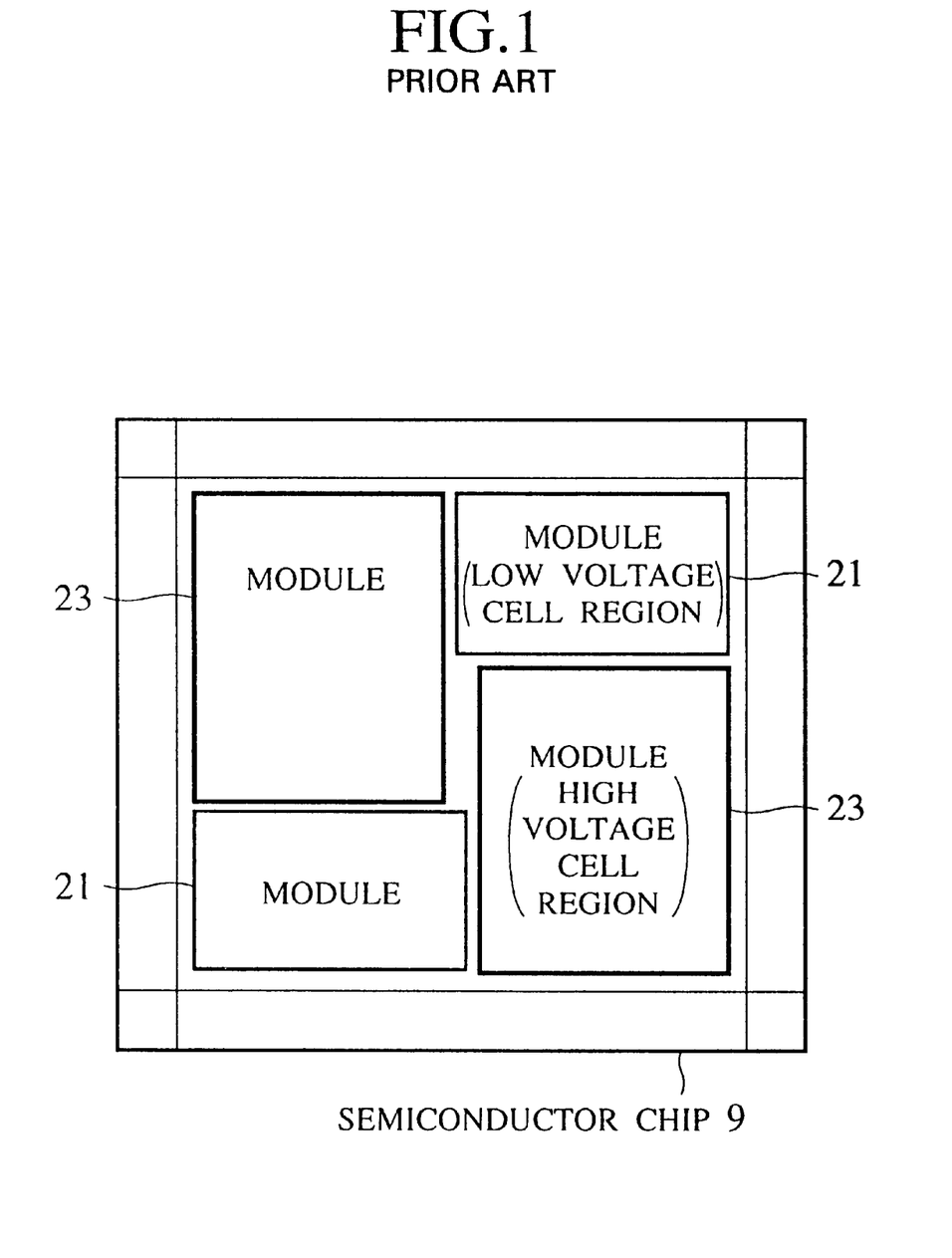
FIG. 1 is a block diagram showing a conventional semiconductor integrated circuit.

FIG. 1 is a diagram showing a configuration of modules 21 and 23 incorporated in a conventional semiconductor integrated circuit 9. This conventional semiconductor integrated circuit 9 operates under different supply voltages in a same semiconductor chip, namely having modules as a low power cell region 21 designated by fine lines and modules as a high power cell region 23 designated by solid lines. It is thereby possible to reduce a power consumption of a semiconductor integrated circuit according to this configuration of the conventional semiconductor integrated circuit in which a supply voltage to be desired is changed per module.

However, this conventional configuration of the conventional semiconductor integrated circuit causes a case in which it becomes difficult to keep a desired operation speed in a module when the entire voltage potential for driving this module is reduced. For example, the driving performance of a cell in this module to drive a device as a large load located in the outside of this module is decreased and a delay time is increased by reducing the magnitude of the supply voltage. When this cell is on a signal line (as a critical pass) having a strict timing, the entire performance of the chip of the semiconductor integrated circuit is reduced.

In addition, a time required for switching gates incorporated in this cell becomes long, and the power consumption of this cell corresponding to the increasing of the magnitude of a penetrate current is also increased. Furthermore, this bad influence affects the following circuits because this cell generates bad signal outputs and provides the bad signal outputs to the following circuits. The generation of the bad signal outputs causes to increase a signal delay and a power consumption in the following circuits.

Thereby, the conventional semiconductor integrated circuit has a drawback in which it is difficult to obtain a desired merit or the performance of the conventional semiconductor integrated circuit becomes greatly low by reducing the magnitude of the supply voltage, because the magnitude of the supply voltage is changed per block or per module in the conventional semiconductor integrated circuit.

SUMMARY OF THE INVENTION

Accordingly, an object of the present invention is, with due consideration to the drawbacks of the conventional semiconductor integrated circuit, to provide a semiconductor integrated circuit of a low power consumption type that is capable of reducing the power consumption while keeping the performance of the semiconductor integrated circuit.

In accordance with a preferred embodiment of the present invention, a semiconductor integrated circuit of a low power consumption type that operates under a plurality of supply voltages, comprises a plurality of modules, each module comprising a plurality of cells including cells operating under the plurality of supply voltages, and the plurality of cells being arranged in a plurality of cell rows or cell columns, and electrical wires, each wire being formed on each of the plurality of cell rows or cell columns. In the semiconductor integrated circuit above, one of the plurality of supply voltages is provided to each cell row or each cell column in the plurality of cell rows or cell columns through each of the electrical wires formed on the cell row or cell column.

In accordance with another preferred embodiment of the present invention, a semiconductor integrated circuit of a low power consumption type that operates under a plurality of supply voltages, comprises a plurality of modules, each module comprising a plurality of cells including cells that operate under the plurality of supply voltages, and the plurality of cells being arranged in a plurality of cell rows or cell columns, electrical wires, each wire being formed on each of the plurality of cell rows or cell columns, and a voltage generation section for generating the plurality of supply voltages and for providing the plurality of supply voltages to the plurality of modules. In the semiconductor integrated circuit above, one of the plurality of supply voltages generated by the voltage generation section is provided to each cell row or each cell column in the plurality of cell rows or cell columns through each of the electrical wires formed on the cell row or cell column.

In accordance with another preferred embodiment of the present invention, a semiconductor integrated circuit of a low power consumption type that operates under a plurality of supply voltages, comprises a plurality of modules, each module comprising a plurality of cells including cells that operates under the plurality of supply voltages, and the plurality of cells being arranged in a plurality of cell rows or cell columns, first wires, each first wire being formed on each of the plurality of cell rows or cell columns and through which one of the plurality of supply voltages is provided to each cell row or each cell column in the plurality of cell rows or cell columns, and second wires, each second wire being formed in a direction being perpendicularly intersecting to the direction of each cell row or cell column in each module, and through which other supply voltage in the plurality of supply voltages is provided to each cell row or each cell column in the plurality of cell rows or cell columns, and a plurality of pairs of power cells and filler cells arranged in a plurality of rows or columns, each row or column of the power cells and the filler cells arranged along a direction that being in parallel to the direction of the second wires and being perpendicularly intersecting to the direction of each cell row or cell column in each module, the power cell providing one of the plurality of supply voltage and a filler cell preventing the supply of the supply voltage, and each pair of power cell and filler cell being formed at each cross section of each first wire and each second wire on each cell row or cell column, and one of the plurality of supply voltages being provided to each cell in each cell row or cell column through the power cell.

In the semiconductor integrated circuit described above as another preferred embodiment of the present invention, each of the plurality of modules comprises cell rows or cell columns arranged in a center section of the module and cell rows or cell columns arranged in a peripheral section of the center section of the module, and wherein one supply voltage in the plurality of supply voltages is provided to the cell rows or cell columns arranged in the center section of the module and other supply voltage is provided to the cell rows or cell columns arranged in the peripheral section of the center section of the module.

In the semiconductor integrated circuit described above as another preferred embodiment of the present invention, each module in the plurality of modules comprises first cell rows or cell columns, to which a first supply voltage in the plurality of supply voltages is provided, for performing data input/output operation inside of this module, and second cell rows or cell columns, to which a second supply voltage in the plurality of supply voltages is provided, for performing data input/output operation to outside of this module.

In the semiconductor integrated circuit described above as another preferred embodiment of the present invention, a ground wire for each of the electrical wires to which the plurality of supply voltages are provided formed in each module in the plurality of modules is separated electrically to each other.

In the semiconductor integrated circuit described above as another preferred embodiment of the present invention, the voltage generation section generates and provides a different supply voltage to each cell row or each cell column forming each module in the plurality of modules.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the semiconductor integrated circuit of a low power consumption type according to the present invention will now be described with reference to the drawings.

First Embodiment

Figure 2:
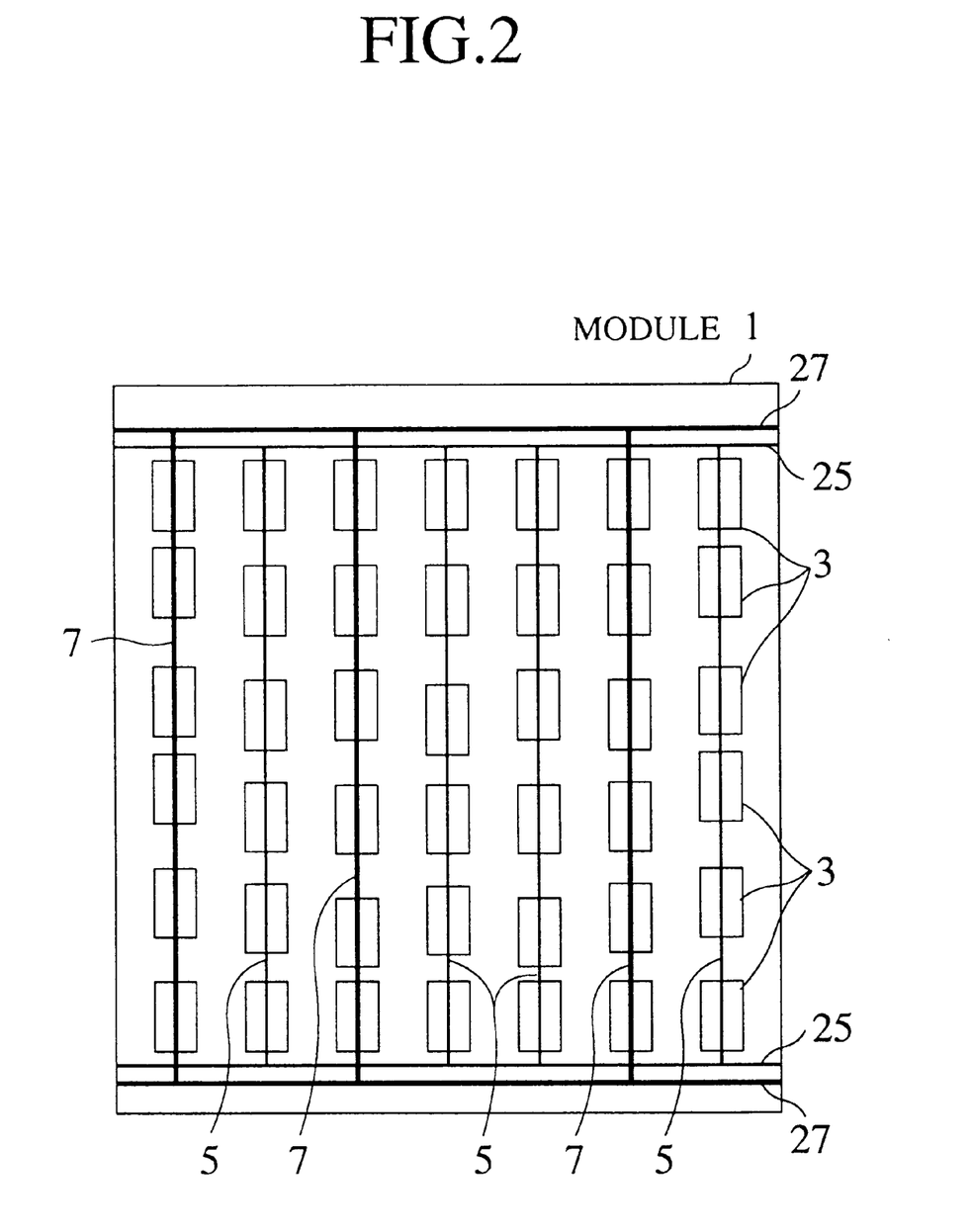
FIG. 2 is a block diagram showing a configuration of a module in a semiconductor integrated circuit as a first embodiment of the present invention.

FIG. 2 is a block diagram showing a configuration of a module in a semiconductor integrated circuit as a first embodiment of the present invention. FIG. 2 shows a part of the chip of the semiconductor integrated circuit as the first embodiment in which a different supply voltage is provided per cell row or per cell column in a module 1. In this embodiment, the technical term "per cell row" means also per "cell column". In FIG. 2, a rectangular shape in the module 1 indicates a cell 3. Each cell row or each cell column comprises a plurality of cells 3. Lines formed on each cell row designate electrical wires (or electrical wirings) 5 and 7 through which supply voltages are provided to each cell 3. In FIG. 2, two supply voltage, a high supply voltage and a low supply voltage are shown. That is, the solid lines, the first, third, and sixth lines, counted from left side designate the wire 7 of the high supply voltage and the fine lines, the second, fourth, fifth, and seventh lines, counted from the left side designate the wire 5 of the low supply voltage. In the peripheral section of the cell column section in the module 1, the power supply electrical wires 25 and 27 are formed in order to supply both the high supply voltage and the low supply voltage to the electrical wires 5 and 7 on the rows or columns, respectively. The desired supply voltage is provided to each cell column or each cell row through the wires 25 and 27 and the wires 5 and 7. The power supply wires 25 and 27 are also connected to power supply wires in an input/output (I/O) region (not shown) in order to supply the desired supply voltage to each cell column or each cell row.

In the semiconductor integrated circuit, the voltage potential to be supplied to each cell can be determined optionally. That is, this can be achieved only by connecting the wires 5 and 7 formed on each cell column or each cell row to the wires 25 and 27 in the peripheral section of the module 1.

Thus, it is possible to keep the performance of the semiconductor integrated circuit and to reduce the power consumption of it by using the configuration of the first embodiment in which the wire 7 of the high supply voltage and the wire 5 of the low supply voltage are separated electrically.

Figure 3:
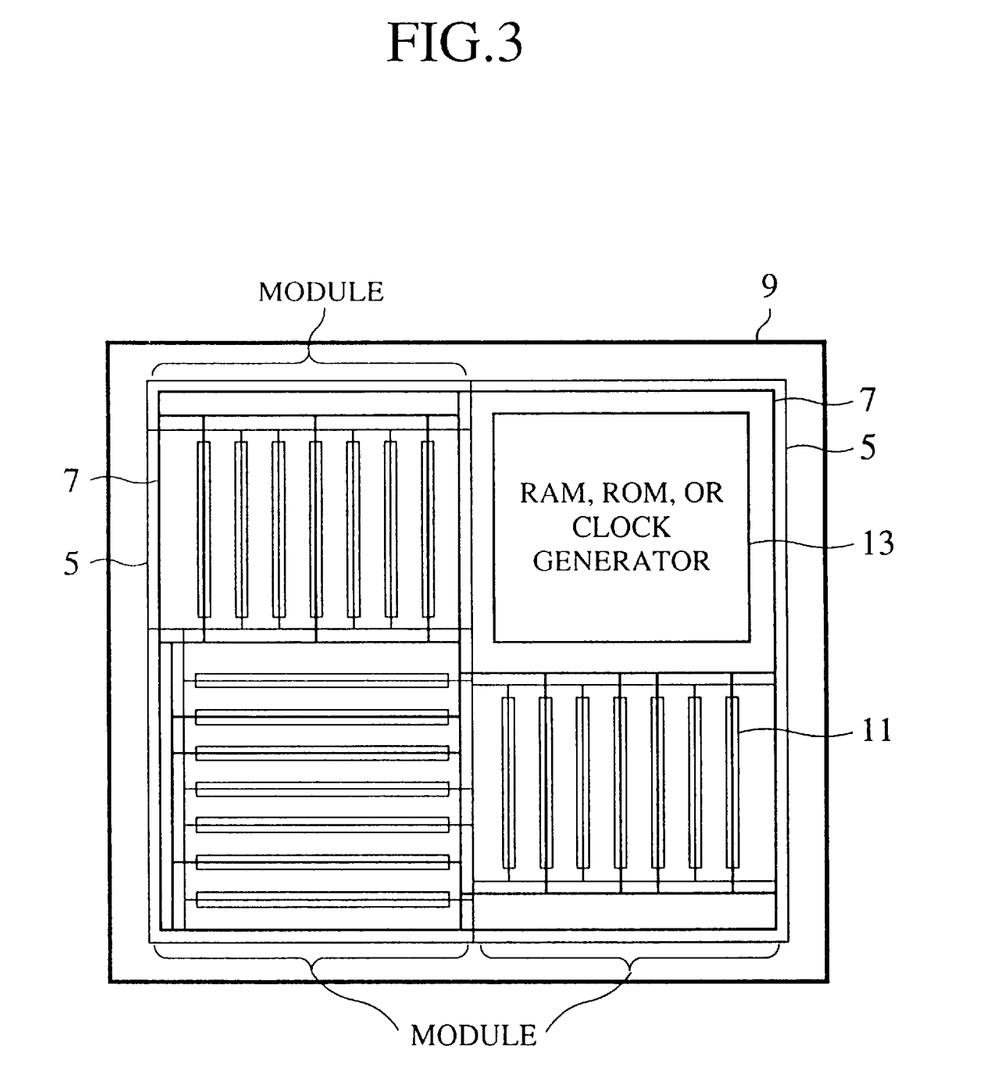
FIG. 3 is a block diagram showing an entire configuration of the semiconductor integrated circuit of the first embodiment in which a plurality of modules including the module shown in FIG. 2 are arranged.

FIG. 3 is a block diagram showing the entire configuration of the semiconductor integrated circuit as the first embodiment in which a plurality of modules including the module shown in FIG. 2 are arranged. In the semiconductor integrated circuit 9 shown in FIG. 3, each module has the configuration shown in FIG. 2 and the reference number 11 indicates each cell column or each cell row shown in FIG. 2. On each cell column 11, only one of the power supply electrical wires 5 and 7 of the low supply voltage and the high supply voltage is formed. Each cell column 11 receives the desired supply voltage through those power supply wires. In the area between the adjacent modules, the wires connected to the wires in the I/O region (not shown) are formed.

It is acceptable to form the wires 5 and 7 of the supply voltages in a longitudinal direction or in a lateral direction or in the combination of the longitudinal direction and the lateral direction. Furthermore, it is also acceptable to form the modules including a hard-mega cell 13 on the semiconductor integrated circuit of the first embodiment. When a pre-designed macro is incorporated in the semiconductor integrated circuit, a supply voltage to be required by the pre-designed macro is supplied to the pre-designed macro.

By forming a semiconductor integrated circuit having the configuration shown in FIG. 3, it is possible to reduce a design working period to be required for designing the semiconductor integrated circuit because pre-designed modules such as pre-designed macros of a low power consumption type can be used.

Figure 4:
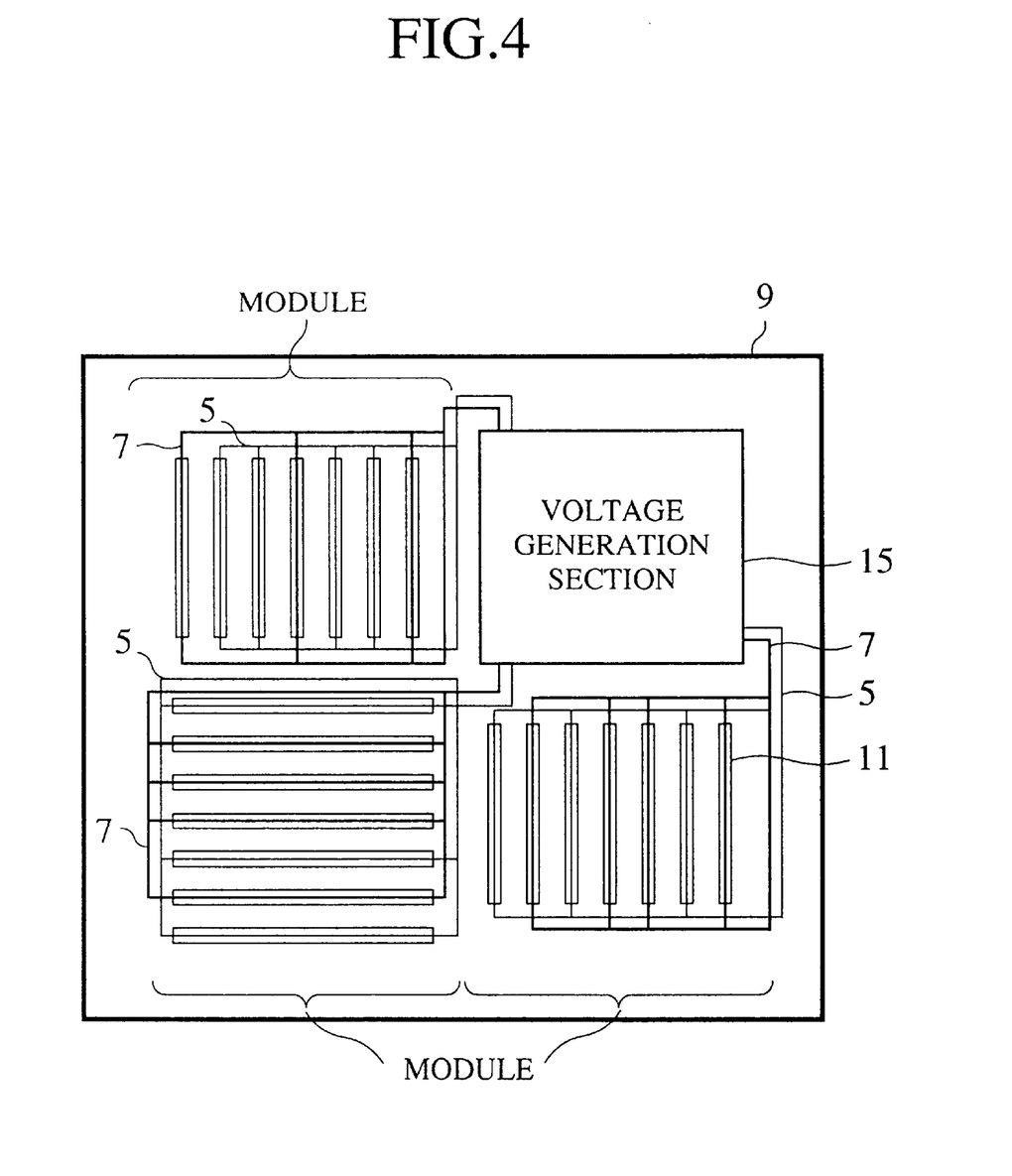
FIG. 4 is a block diagram showing another configuration of the semiconductor integrated circuit as the first embodiment in which a module of a voltage generation section is further incorporated.

FIG. 4 is a block diagram showing another configuration of the semiconductor integrated circuit as the first embodiment in which a module of a voltage generation section is further incorporated. As shown in FIG. 4, the semiconductor integrated circuit includes the voltage generation section 15 for generating desired supply voltages. That is, the voltage generation section 15 may generate a plurality of supply voltages, for example, two kinds of supply voltages such as the high supply voltage and the low supply voltage. The high voltage is supplied through the wire 7 of the high supply voltage and the low voltage is supplied through the wire 5 of the low supply voltage to target cells in each cell column 11. By using this configuration in which the voltage generation section is incorporated in the semiconductor integrated circuit as a module, it is possible to provide the desired supply voltages to each cell column in the semiconductor integrated circuit without receiving the desired supply voltages provided from outside of the semiconductor integrated circuit. It is thereby possible to provide a semiconductor integrated circuit that is applicable to widely use.

In addition, it is also possible to form a semiconductor integrated circuit in which a supply voltage to be supplied to each cell is changed based on requirements. In this case, it is possible to reduce the power consumption of the semiconductor integrated circuit.

Second Embodiment

Next, a description will be given of the operation and the configuration of the semiconductor integrated circuit as the second embodiment of the present invention with reference to FIGS. 5 to 7.

Figure 5:
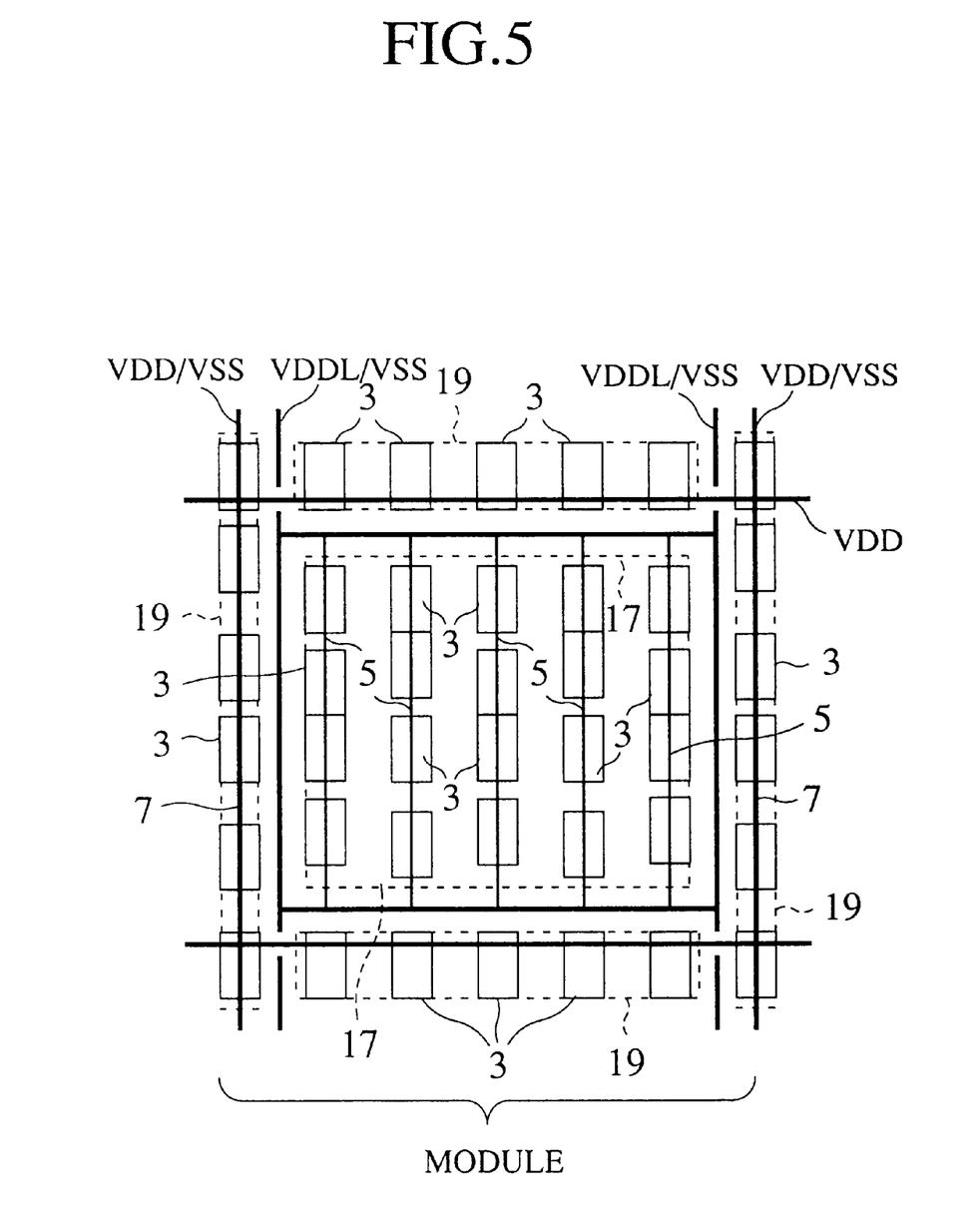
FIG. 5 is a block diagram showing the internal configuration of one of modules arranged in a semiconductor integrated circuit according to a second embodiment of the present invention.

FIG. 5 is a block diagram showing the internal configuration of one of modules arranged in the semiconductor integrated circuit according to the second embodiment of the present invention. This module shows a part of the semiconductor integrated circuit of the low power consumption type according to the second embodiment to which a plurality of supply voltages are provided.

In the following description of the second embodiment, two supply voltages, the high supply voltage and the low supply voltage are used.

In FIG. 5, dotted lines 17 designate the group of cell columns located in the center of the module. The low supply voltage is supplied into the group 17 of the cell columns through the wires 5 of the low supply voltage.

On the other hand, the high supply voltage is supplied into the group 19 of the cell columns formed in the peripheral area of this module through the wires 7 of the high voltage. In addition, at the peripheral section of the group 17 of the cell columns to which the low supply voltage is supplied, wires of the power supply is formed. The entire shape of the wires is a ring shape. The I/O region (omitted from the drawing) of the semiconductor chip is connected to the wires in order to provide the voltage of the power supply to those wires.

On the other hand, wires of the high supply voltage are formed between the group 19 of the cell columns and the wires of the low supply voltage in order to supply the high supply voltage through the I/O region (not shown).

Thus, the group 17 of the cell columns to which the low supply voltage is provided is formed at the center section of the module and the group 19 of the cell columns to which the high supply voltage is supplied is formed at the peripheral area of the group 17, because cells for performing data input/output (I/O) transmission from/to cells that are placed in outside of this module are commonly placed at the peripheral section of this module. In general, it is required to supply the high supply voltage when data transfer between the cells in this module and other module is performed because the length of a wiring between the cells in those different modules becomes long. Conversely, when data I/O transfer is performed between cells placed in a same module, the length of a wiring between those cells becomes short, so that the low supply voltage may be used. For the above reason, the module in the semiconductor integrated circuit of the second embodiment has the configuration, as shown in FIG. 5.

Furthermore, in the configuration of the semiconductor integrated circuit according to the second embodiment, the ground wire of the high supply voltage and the ground wire of the low supply voltage are separated. It is thereby possible to reduce a bad influence caused by noises from the high supply voltage and the low supply voltage.

Figure 6:
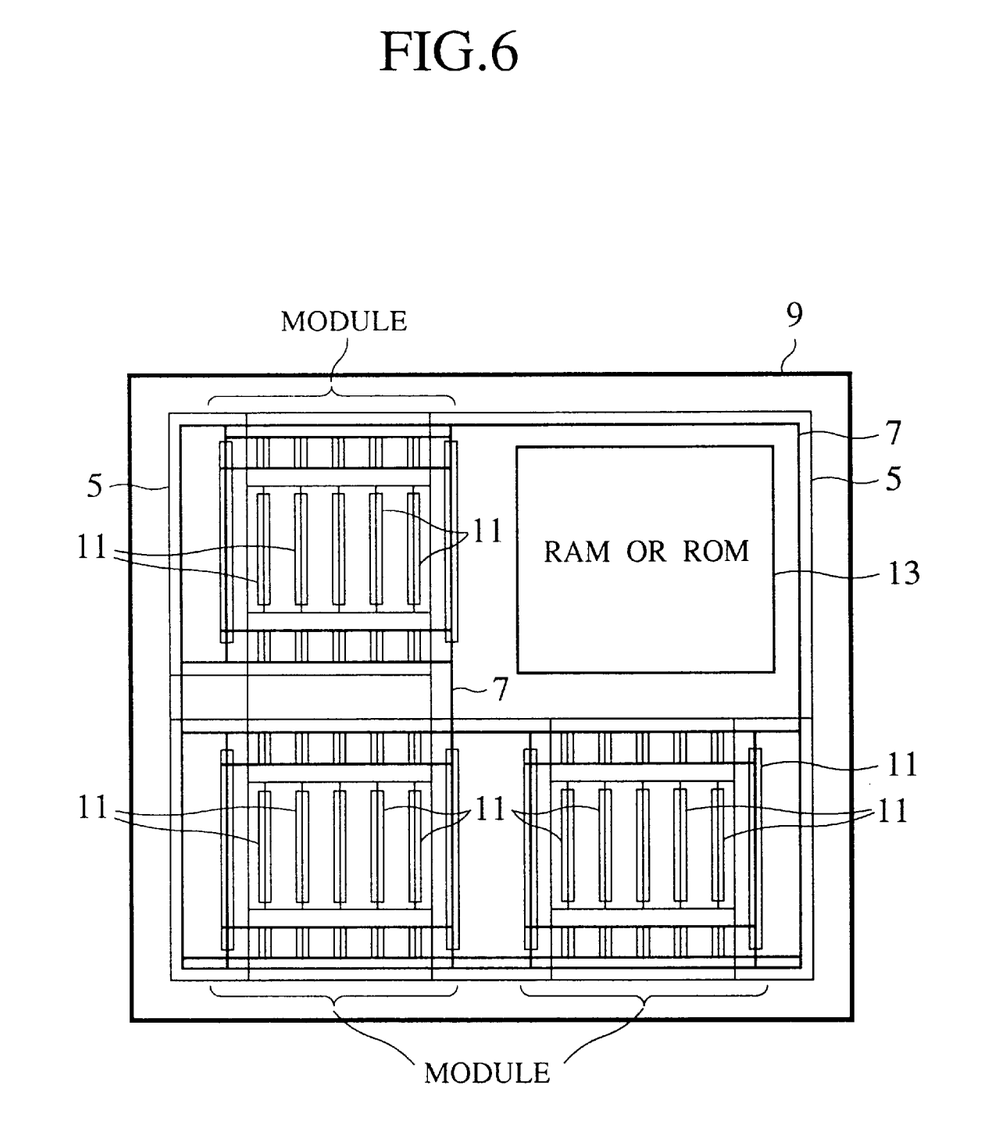
FIG. 6 is a block diagram showing another configuration of the semiconductor integrated circuit as the second embodiment shown in FIG. 5.

FIG. 6 is a block diagram showing another configuration of the semiconductor integrated circuit as the second embodiment shown in FIG. 5.

FIG. 6 shows an example of the semiconductor integrated circuit in which a plurality of the modules each having the configuration shown in FIG. 5 are arranged.

One of the wire 7 of the high supply voltage and the wire 5 of the low supply voltage is formed on each cell column 11 or each cell row. The desired supply voltage is supplied to each column or each row in each module through the wire 5 of the low supply voltage and the wire 7 of the high supply voltage. Between adjacent modules, the wires 5 and 7 are connected to the power sources in the I/O region (not shown) of the semiconductor integrated circuit. In addition, in order to supply the desired supply voltage to each cell column, the wires connected to the I/O region (not shown) are also formed in the peripheral regions of both the group 17 placed at the center section and the group 19 of the cell columns in each module, as shown in FIG. 5.

Moreover, it is acceptable to form the wire on each cell column in one direction such as longitudinal direction or lateral direction or in a combination direction including both the longitudinal direction and the lateral direction. Furthermore, it is also acceptable to incorporate a hard-mega cell 13 such as a RAM and a ROM in the semiconductor integrated circuit, as shown in FIG. 6.

Thus, according to the semiconductor integrated circuit of the second embodiment, it is possible to reduce the design working period of a semiconductor integrated circuit in addition to the effect obtained by the configuration of the first embodiment shown in FIG. 5 because pre-designed modules that have been designed under the concept of the low power consumption type of the present invention may be used without any change.

Figure 7:
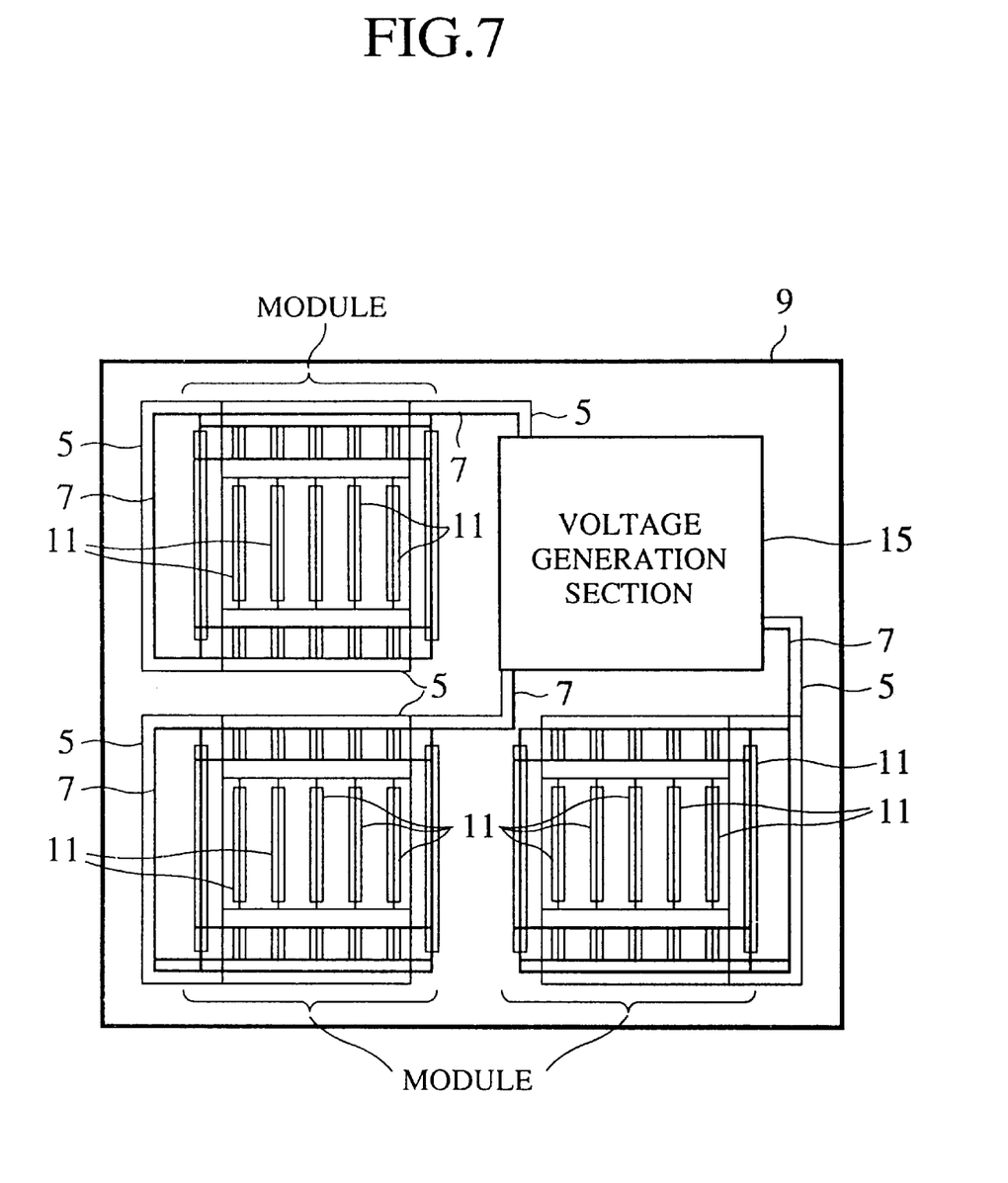
FIG. 7 is a block diagram showing another configuration of the semiconductor integrated circuit as the second embodiment in which a module of a voltage generation section is further incorporated.

FIG. 7 is a block diagram showing another configuration of the semiconductor integrated circuit as the second embodiment in which a module of a voltage generation section is further incorporated.

In the semiconductor integrated circuit as another configuration shown in FIG. 7, the voltage generation section 15 is further incorporated. Other components are the same as those of the semiconductor integrated circuit shown in FIG. 6. The voltage generation section 15 is capable of generating and supplying a plurality of supply voltages such as the high supply voltage and the low supply voltage. For example, the high supply voltage is supplied to each cell column 11 in each module through the wire 7 of the high supply voltage and the low supply voltage is supplied to each cell column 11 in each module through the wire 5 of the low supply voltage. Because it is thereby possible to generate and supply the desired supply voltage to each cell column within the semiconductor integrated circuit, it is not required to provide the desired supply voltages from outside. This configuration causes to make semiconductor integrated circuits that are widely applicable to various applications products.

As described above, because a different supply voltage is provided per module or per block, not each cell column or cell row in the configuration of the conventional semiconductor integrated circuit operating under multiple supply voltages designed by the conventional layout method. Accordingly, this conventional configuration causes to reduce the performance of the conventional semiconductor integrated circuit when it performs under a low supply voltage.

In order to eliminate the conventional drawback, according to the semiconductor integrated circuit of the second embodiment, it is possible to reduce the power consumption of the semiconductor integrated circuit by providing a different supply voltage to each cell column while keeping the performance of the semiconductor integrated circuit.

Third Embodiment

Figure 8:
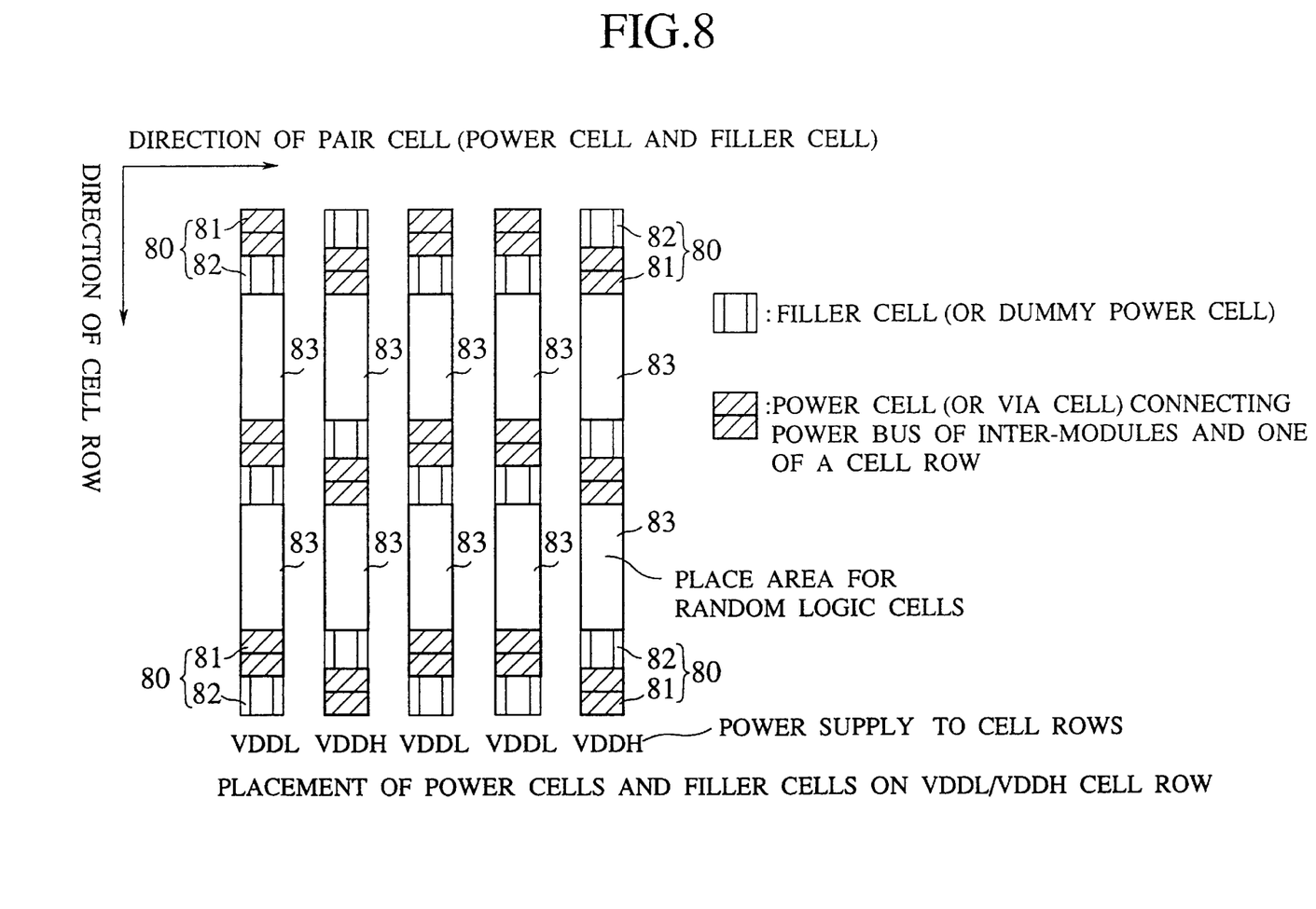
FIG. 8 is a block diagram showing a configuration of cell rows including power cells and filler cells in a module incorporated in a semiconductor integrated circuit according to a third embodiment of the present invention.

FIG. 8 is a block diagram showing a part of a configuration of a semiconductor integrated circuit according to the third embodiment of the present invention. FIG. 8 shows the part of the semiconductor chip of the semiconductor integrated circuit on which circuit modules capable of operating under two supply voltages are arranged. In the area shown in FIG. 8, a plurality of cell rows to which the two kinds of supply voltages are supplied are arranged. Those two kinds of supply voltages are the high supply voltage (or normal supply voltage) VDDH and the low supply voltage VDDL, and one of those supply voltages is supplied to each cell row through each of the electrical wires.

In the semiconductor integrated circuit of the third embodiment according to the present invention shown in FIG. 8, a plurality of pair cells 80 are arranged. Each pair cell 80 comprises a power cell 81 and a filler cell 82 (it is also referred to as a dummy power cell). One of the supply voltage VDDH/VDDL is supplied to each cell in the cell row through the power cell 81. The filler cell 82 prevents to provide the supply voltage to each cell. The direction of placement of the pair cells 80 is perpendicularly intersecting to the direction of placement of each cell row. Thus, the pair cells 80, each including the power cell 81 and the filler cell 82, are arranged on each cell row in the direction that is perpendicularly intersecting to the direction of each cell row.

The power cell 81 in each pair cell 80 may connect electrically a wire (a first wire) that is formed on each cell row in parallel to a wire (a second wire) that is formed on the power cell 81 in the direction that is perpendicularly intersecting to each cell row.

The filler cell 82 in each pair cell 80 may prevent to connect the first wire to the second wire.

Thus, it is possible to provide a desired supply voltage to each cell row through the power cell 81 by forming the power cell 81 under the second wire, whose direction is perpendicularly intersecting to the direction of the cell row, on the other hand, the filler cell 82 prevents to supply undesired voltage to each cell row because the filler cell 82 is formed under the wire supplying un-desired supply voltage.

In each module, the placement of the pair cells 80, each pair cell 80 including the power cell 81 and the filler cell 82, is formed on optional area in a same pattern. Thereby, a desired supply voltage may be supplied to each cell row through the plurality of wires whose direction is perpendicularly intersecting to the direction of each cell row.

Normal cells are arranged on the area in the cell row designated by the reference character 83 shown in FIG. 8 in which any pair cell 80 is not arranged.

As described above, by selectively connecting the power cell 81 and the filler cell 82 in each pair cell 80 to each cell row through a power supply pin of the power cell 81 (the power supply pin of the power cell will be described later in detail), a different supply voltage may be provided to each cell row. For example, when a circuit operating under two supply voltages is formed on a cell row in the semiconductor integrated circuit of the third embodiment of the present invention, the normal cell that operates under the normal supply voltage VDDH is arranged on the cell row to which the normal supply voltage VDDH is provided, and cells operating under the low supply voltage VDDL are arranged on the cell row to which the low supply voltage VDDL is provided.

Figure 9:
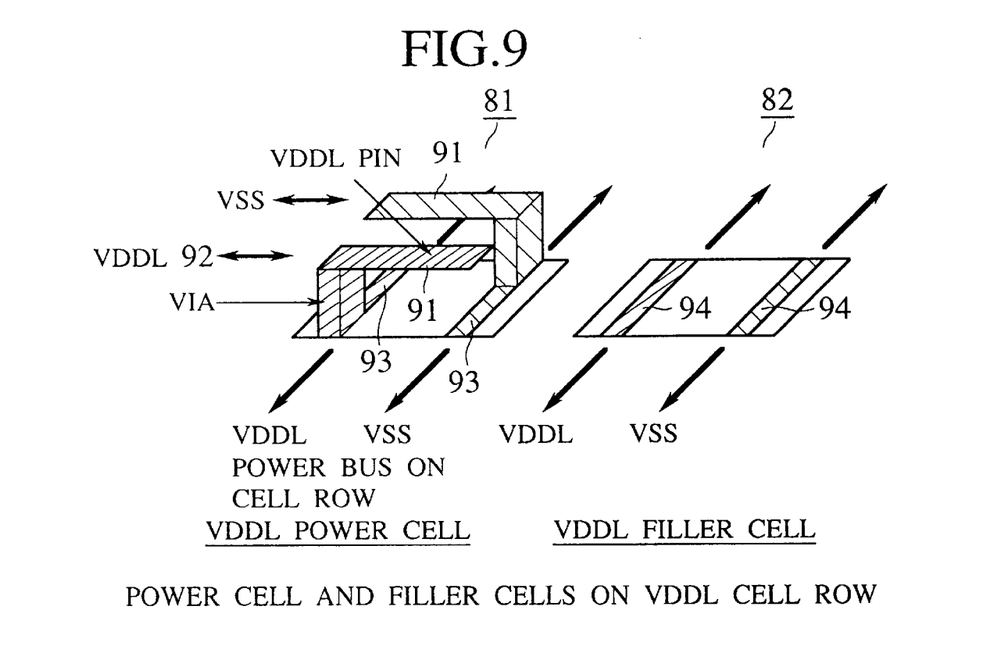
FIGS. 9 and FIG. 10 are block diagrams showing configurations of a power cell and a filler cell arranged in a module in the semiconductor integrated circuit as the third embodiment of the present invention shown in FIG. 8.
Figure 10:
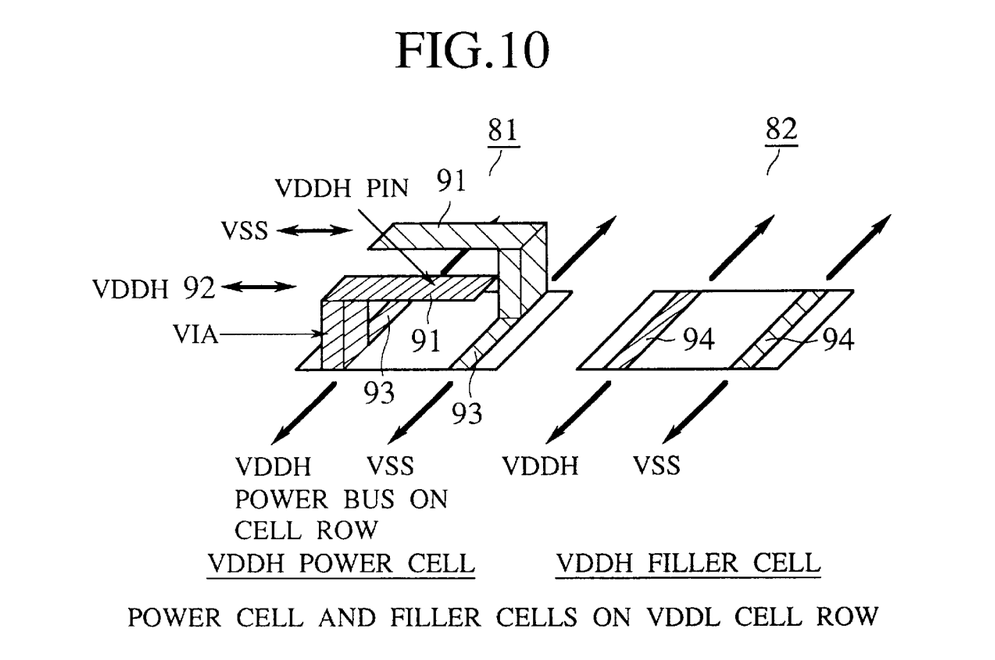

Next, a configuration of the power cell 81 and the filler cell 82 will be explained in detail.

FIG. 9 and FIG. 10 are block diagrams showing configurations of the power cell 81 and the filler cell 82 in the pair cell 80 arranged in a module in the semiconductor integrated circuit as the third embodiment of the present invention shown in FIG. 8.

FIG. 9 shows the configuration of the power cell 81 and the filler cell 82 to be arranged on a cell row of the low supply voltage VDDL. FIG. 10 shows the configuration of the power cell 81 and the filler cell 82 to be arranged on a cell row of the high supply voltage VDDH.

As shown in both FIGS. 9 and 10, the power cell 81 and the filler cell 82 formed on the cell rows of both the high and the low supply voltages VDDH and VDDL are same in configuration. In the semiconductor integrated circuit of the third embodiment, in order to remove misunderstanding in design, the power cells and the filler cells to be used under the normal supply voltage and the low supply voltage are designated by using the reference characters Power H/Filler H and Power L/Filler L, respectively.

In order to connect electrically a wiring (the first wire) of the power source to a wiring (the second wire) of the power source, the power cell 81 comprises a power supply pin 91 of an upper layer and a VIA 92 through which the power supply pin 91 is connected to a power supply pin as a lower layer on a cell row. That is, a desired supply voltage is supplied through the second wire that is formed in the direction that is perpendicularly intersecting to the direction of each cell row. The first wire is formed in the direction that is in parallel of the direction of each cell row consisting of cells.

The power cell 81 has the same configuration described above for the ground voltage (omitted from the drawing). The filler cell 82 has only a power supply pin in the lower layer, no power supply pin in the upper layer. This configuration of the filler cell 92 is different in configuration from the configuration of the power cell 81. Both the power supply pin 93 in the lower layer of the power cell 81 and the power supply pin 94 in the lower layer of the filler cell 82 are used for connecting the wiring (the first wire) of the supply voltage formed on the cell row in parallel.

Figure 11:
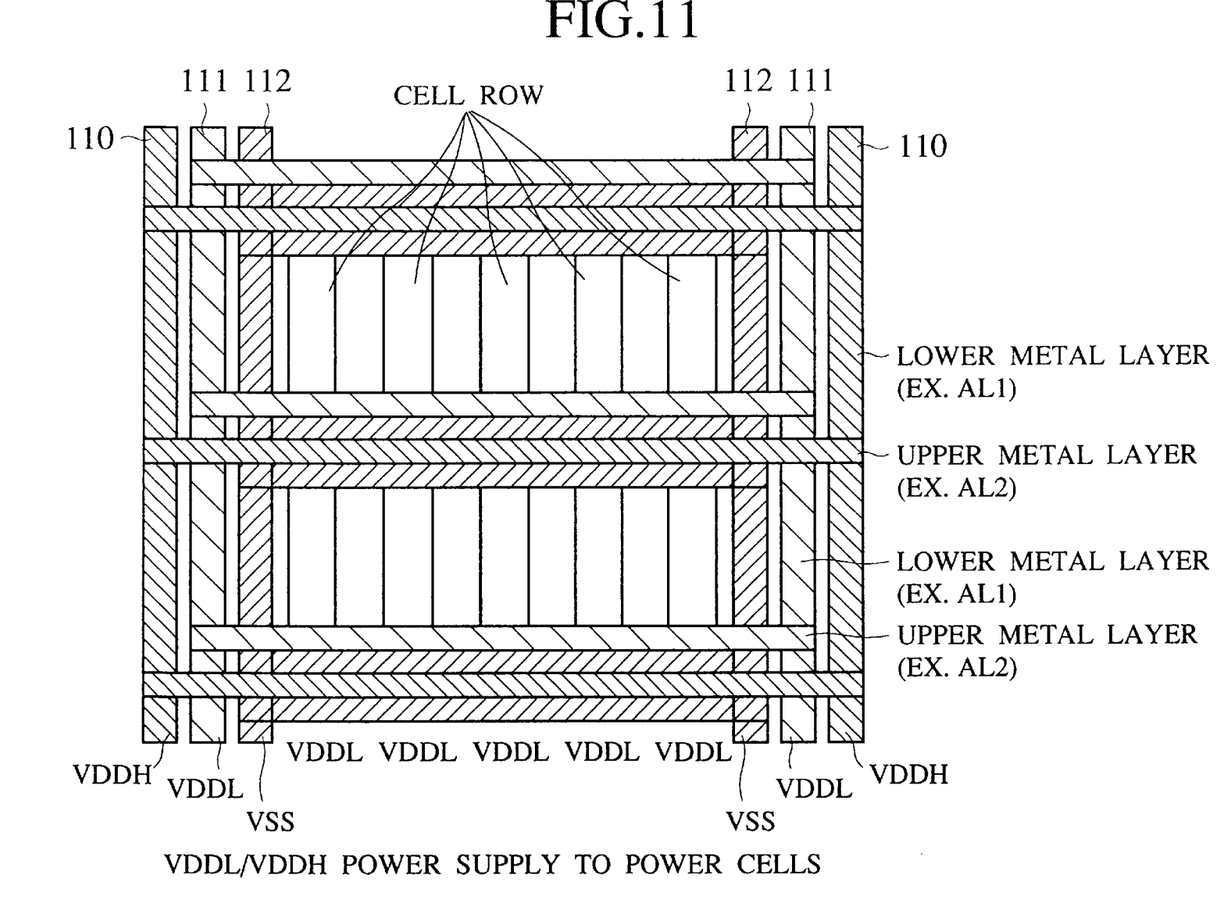
FIG. 11 is a diagram showing a configuration of wires of desired supply voltages VDDL/VDDH arranged in modules each including cell rows in the semiconductor integrated circuit as the third embodiment of the present invention.

FIG. 11 is a diagram showing a configuration of wires of desired supply voltages VDDL/VDDH arranged in modules each including cell rows in the semiconductor integrated circuit as the third embodiment of the present invention.

Outside of the circuit modules, wide buses 110, 111, and 112 of power sources are formed. The wires of the power sources and the ground wires connected to the wide buses 110, 111, and 112 are formed in the direction that is perpendicularly intersecting to the direction of each cell row. Each wire of the power source is formed on the power cell 81 and the filler cell 82. The power supply pin of the power cell 81 is connected to this wire in order to supply the desired supply voltage to each cell in each cell row. Because the VIA 92 is formed in the power cell 81, it is not required to form the VIA during design process of wiring. The power supply pins of all of the power cell 81 formed on the cell rows are connected to the ground voltage. This process to form the wires is also performed for wires of other supply voltage.

As described above, according to the semiconductor integrated circuit of the third embodiment, a different supply voltage may be supplied per cell row by changing the pattern of the power cell and the filler cells.

As set fourth in detail, the semiconductor integrated circuit of a low power consumption type has the configuration in which each of a plurality of modules comprises a plurality of cells including cells operating under the plurality of supply voltages, and the plurality of cells are arranged in a plurality of cell rows or cell columns, and, each of electrical wires is formed on each of the plurality of cell rows or cell columns, and one of the plurality of supply voltages is provided to each cell row or each cell column in the plurality of cell rows or cell columns through each of the electrical wires formed on the cell row or cell column. It is thereby possible to reduce the power consumption of the semiconductor integrated circuit while keeping the performance of the semiconductor integrated circuit.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor integrated circuit of a low power consumption type that operates under a plurality of supply voltages, comprising:

a plurality of modules, each module comprising a plurality of random logic cells including cells operating under the plurality of supply voltages different from each other, and the plurality of random logic cells being arranged in a plurality of cell rows or cell columns; and electrical wires, each wire being formed on each of the plurality of cell rows or cell columns, wherein one of the plurality of supply voltages is provided to each cell row or each cell column in the plurality of cell rows or cell columns through each of the electrical wires formed on the cell row or cell column.

2. A semiconductor integrated circuit of a low power consumption type as claimed in claim 1, wherein each of the plurality of modules comprises cell rows or cell columns having random logic cells and arranged in a center section of the module and cell rows or cell columns arranged in a peripheral section of the center section of the module, and wherein one supply voltage in the plurality of supply voltages is provided to the cell rows or cell columns arranged in the center section of the module and other supply voltage which is lower than said one supply voltage is provided to the cell rows or cell columns arranged in the peripheral section of the center section of the module.

3. A semiconductor integrated circuit of a low power consumption type as claimed in claim 1, wherein each module in the plurality of modules comprises:

first cell rows or cell columns having random logic cells, to which a first supply voltage in the plurality of supply voltages is provided, for performing data input/output operation inside of this module; and second cell rows or cell columns having random logic cells, to which a second supply voltage which is lower than said first supply voltage in the plurality of supply voltages is provided, for performing data input/output operation to outside of this module.

4. A semiconductor integrated circuit of a low power consumption type as claimed in claim 2, wherein each module in the plurality of modules comprises:

first cell rows or cell columns, to which a first supply voltage in the plurality of supply voltages is provided, for performing data input/output operation inside of this module; and second cell rows or cell columns, to which a second supply voltage in the plurality of supply voltages is provided, for performing data input/output operation to outside of this module.

5. A semiconductor integrated circuit of a low power consumption type that operates under a plurality of supply voltages different from each other, comprising:

a plurality of modules, each module comprising a plurality of cells having random logic cells and including cells that operate under the plurality of supply voltages, and the plurality of random logic cells being arranged in a plurality of cell rows or cell columns;

electrical wires, each wire being formed on each of the plurality of cell rows or cell columns; and a voltage generation section for generating the plurality of supply voltages and for providing the plurality of supply voltages to the plurality of modules, wherein one of the plurality of supply voltages generated by the voltage generation section is provided to each cell row or each cell column in the plurality of cell rows or cell columns through each of the electrical wires formed on the cell row or cell column.

6. A semiconductor integrated circuit of a low power consumption type as claimed in claim 5, wherein the voltage generation section generates and provides a different supply voltage to each cell row or each cell column forming each module in the plurality of modules.

7. A semiconductor integrated circuit of a low power consumption type that operates under a plurality of supply voltages, comprising:

a plurality of modules, each module comprising a plurality of cells including cells that operates under the plurality of supply voltages, and the plurality of cells being arranged in a plurality of cell rows or cell columns;

first wires, each first wire being formed on each of the plurality of cell rows or cell columns and through which one of the plurality of supply voltages is provided to each cell row or each cell column in the plurality of cell rows or cell columns;

second wires, each second wire being formed in a direction being perpendicularly intersecting to the direction of each cell row or cell column in each module, and through which other supply voltage in the plurality of supply voltages is provided to each cell row or each cell column in the plurality of cell rows or cell columns; and a plurality of pairs of power cells and filler cells arranged in a plurality of rows or columns, each row or column of the power cells and the filler cells arranged along a direction that being in parallel to the direction of the second wires and being perpendicularly intersecting to the direction of each cell row or cell column in each module, the power cell providing one of the plurality of supply voltage and the filler cell preventing the supply of the supply voltage, and each pair of power cell and filler cell being formed at each cross section of each first wire and each second wire on each cell row or cell column, and one of the plurality of supply voltages being provided to each cell in each cell row or cell column through the power cell.

8. A semiconductor integrated circuit of a low power consumption type as claimed in claim 7, wherein each of the plurality of modules comprises cell rows or cell columns arranged in a center section of the module and cell rows or cell columns arranged in a peripheral section of the center section of the module, and wherein one supply voltage in the plurality of supply voltages is provided to the cell rows or cell columns arranged in the center section of the module and other supply voltage is provided to the cell rows or cell columns arranged in the peripheral section of the center section of the module.

9. A semiconductor integrated circuit of a low power consumption type as claimed in claim 7, wherein each module in the plurality of modules comprises:

first cell rows or cell columns, to which a first supply voltage in the plurality of supply voltages is provided, for performing data input/output operation inside of this module; and second cell rows or cell columns, to which a second supply voltage in the plurality of supply voltages is provided, for performing data input/output operation to outside of this module.

10. A semiconductor integrated circuit of a low power consumption type as claimed in claim 7, further comprises a voltage generation section for generating the plurality of supply voltages and for providing the plurality of supply voltages to the plurality of modules, wherein one of the plurality of supply voltages generated by the voltage generation section is provided to each cell row or each cell column in the plurality of cell rows or cell columns through each of the electrical wires formed on the cell row or cell column.

11. A semiconductor integrated circuit of a low power consumption type as claimed in claim 10, wherein the voltage generation section generates and provides a different supply voltage to each cell row or each cell column forming each module in the plurality of modules.

12. A semiconductor integrated circuit comprising:

a plurality of random logic cells arranged in a plurality of rows or columns; and a plurality of power supply lines for supplying a normal supply voltage to said random logic cells, wherein power consumption of said semiconductor integrated circuit is reduced by providing power supply lower voltage lines for supplying a lowered supply voltage lower than said normal supply voltage, wherein a part of said random logic cells are supplied power through said power supply lower voltage lines instead of said power supply lines, and wherein said part of said random logic cells can be normally operated even with said lowered supply voltage.

* * * * *